(12) United States Patent
Yue et al.

(10) Patent No.: US 11,476,300 B2
(45) Date of Patent: Oct. 18, 2022

(54) DISPLAY PANEL AND DISPLAY APPARATUS

(71) Applicant: WuHan TianMa Micro-electronics CO., LTD., Wuhan (CN)

(72) Inventors: Qin Yue, Wuhan (CN); Yangzhao Ma, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 135 days.

(21) Appl. No.: 17/069,516

(22) Filed: Oct. 13, 2020

(65) Prior Publication Data

US 2021/0028227 A1     Jan. 28, 2021

(30) Foreign Application Priority Data

Aug. 31, 2020   (CN) .......................... 202010897790.3

(51) Int. Cl.
    *H01L 27/15*          (2006.01)
    *H01L 33/48*          (2010.01)
    *H01L 33/58*          (2010.01)

(52) U.S. Cl.
    CPC .......... *H01L 27/156* (2013.01); *H01L 33/486* (2013.01); *H01L 33/58* (2013.01)

(58) Field of Classification Search
    CPC ..... H01L 27/156; H01L 33/486; H01L 33/58; H01L 27/3244–3279
    See application file for complete search history.

(56) References Cited

U.S. PATENT DOCUMENTS

2017/0338284 A1\* 11/2017 Tang ................... H01L 27/3211
2021/0066642 A1\* 3/2021 Lee ....................... H01L 51/525

FOREIGN PATENT DOCUMENTS

CN     110676301 A    1/2020
CN     111554829 A    8/2020

OTHER PUBLICATIONS

State Intellectual Property Office of the People's Republic of China, First Office Action, CN Application No. 2020108977903, dated Oct. 27, 2021.

\* cited by examiner

*Primary Examiner* — Jay C Chang
*Assistant Examiner* — Mikka Liu
(74) *Attorney, Agent, or Firm* — Christensen O'Connor Johnson Kindness PLLC

(57) ABSTRACT

Provided are a display panel and a display apparatus including the display panel. The display panel includes, sequentially along a light-exiting direction, a substrate, a plurality of light-emitting units located in a main display region and an optical component-arranging region, and a filter layer including a plurality of color resistors. A density of light-emitting units located in the optical component-arranging region is smaller than a density of light-emitting units located in the main display region. The optical component-arranging region includes a plurality of light-emitting regions and a plurality of light-transmitting regions. The plurality of light-emitting units located in the optical component-arranging region is arranged in the plurality of light-emitting regions. In a direction perpendicular to the substrate, some color resistors of the plurality of color resistors overlap the plurality of light-transmitting regions. The invention reduces the reflectivity of the optical component-arranging region and weakens the phenomenon that metals are visible.

19 Claims, 9 Drawing Sheets

DISPLAY PANEL AND DISPLAY APPARATUS

CROSS-REFERENCE TO RELATED APPLICATIONS

The present application claims priority to Chinese Patent Application No. 202010897790.3, filed on Aug. 31, 2020, the content of which is incorporated herein by reference in its entirety.

TECHNICAL FIELD

The present application relates to the field of display technology, and particularly, to a display panel and a display apparatus.

BACKGROUND

With a display panel having a camera function, a display region of the display panel includes an optical component-arranging region where optical components such as a camera are arranged. In the related art, due to a high light transmittance of the optical component-arranging region, the ambient light, when entering the optical component-arranging region, is reflected by a reflective film in the optical component-arranging region, for example, a cathode of a light-emitting unit, to the human eyes. This increases reflectivity of the optical component-arranging region and makes metals visible.

SUMMARY

In view of the above, embodiments of the present disclosure provide a display panel and a display apparatus, for reducing a reflectivity of an optical component-arranging region and weakening the phenomenon that metals are visible.

In a first aspect, the present disclosure provides a display panel having a main display region and an optical component-arranging region, and the display panel comprises: a substrate; a plurality of light-emitting units located in the main display region and the optical component-arranging region, wherein each of the plurality of light-emitting units comprises a light-emitting layer; and a filter layer comprising a plurality of color resistors. The substrate, the plurality of light-emitting units and the filter layer are sequentially arranged along a light-exiting direction of the display panel, and a density of light-emitting units of the plurality of light-emitting units located in the optical component-arranging region is smaller than a density of light-emitting units of the plurality of light-emitting units located in the main display region. The optical component-arranging region comprises a plurality of light-emitting regions and a plurality of light-transmitting regions, the light-emitting units of the plurality of light-emitting units located in the optical component-arranging region are arranged in the plurality of light-emitting regions, and in a direction perpendicular to a plane of the substrate, some color resistors of the plurality of color resistors overlap the plurality of light-transmitting regions.

In a second aspect, the present disclosure provides a display apparatus, including a display panel according to the first aspect.

The technical solutions of the present disclosure have the following beneficial effects.

In the technical solutions provided by the embodiments of the present disclosure, some color resistors in the filter layer are arranged to overlap the light-transmitting regions, so that when the ambient light is transmitted towards the light-transmitting regions, each of these color resistors can filter light rays having different colors from itself. Thus, amount of light rays entering the light-transmitting regions can be reduced, and amount of light rays reflected by a cathode or other film layers in the light-transmitting regions to human eyes can also be reduced. Thus, by adopting the technical solutions provided by the embodiments of the present disclosure, the reflectivity of the light-transmitting regions in the optical component-arranging region can be effectively reduced, thereby effectively weakening visibility of metals in the optical component-arranging region.

BRIEF DESCRIPTION OF DRAWINGS

In order to more clearly explain technical solutions of embodiments of the present disclosure, the drawings of the embodiments are briefly described as below. The drawings described below are merely some of the embodiments of the present disclosure. On basis of these drawings, those skilled in the art can obtain other drawings.

DESCRIPTION OF EMBODIMENTS

For better understanding of the technical solution of the present disclosure, the embodiments of the present disclosure are described in detail as below.

It should be understood that the embodiments described below are merely some, rather than all of the embodiments of the present disclosure. Based on the embodiments described in the present disclosure, other embodiments obtained by those skilled in the art shall fall within the protection scope of the present disclosure.

The terms used in the embodiments of the present disclosure are merely for the purpose of describing specific embodiments, but not intended to limit the present disclosure. The singular forms of "a", "an" and "the" used in the embodiments of the present disclosure and the appended claims are also intended to include plural forms, unless indicated otherwise.

It should be understood that the term "and/or" used herein merely indicates a relationship describing associated objects, indicating three possible relationships. For example, A and/or B may indicate: A alone exists, A and B exist at the same time, or B alone exists. In addition, the character "/" herein generally means that the associated objects are in an "or" relationship.

It should be understood that, although the terms first, second, third, etc. in the embodiments of the present disclosure are used to describe color resistors and regions, these color resistors and regions should not be limited to these terms, and these terms are only used to distinguish the color resistors and regions from each other. For example, without departing from the scope of the embodiments of the present disclosure, the first color resistor may also be referred to as the second color resistor, and similarly, the second color resistor may also be referred to as the first color resistor.

Before describing the technical solutions of the embodiments of the present disclosure, the problems in the related art are first discussed below.

Figure 1:
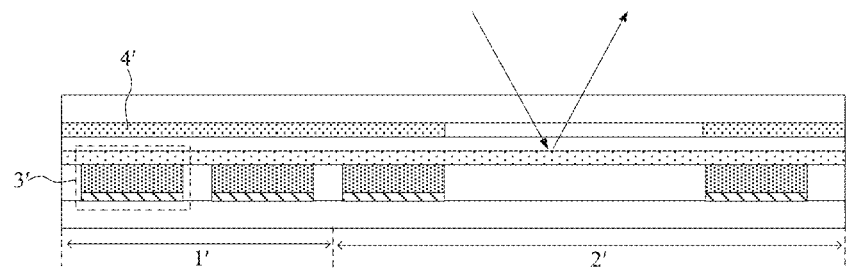
FIG. 1 is a cross-sectional view of a display panel in the related art.

FIG. 1 is a cross-sectional view of a display panel having camera function in the related art. A display region of the display panel includes a regular display region 1' and an optical component-arranging region 2'. A plurality of light-emitting units 3' is provided in the conventional display region 1' and the optical component-arranging region 2'. A density of the light-emitting units 3' in the optical component-arranging region 2' is smaller than a density of the light-emitting units 3' in the conventional display region 1'. In addition, the display panel further includes a filter structure 4' arranged on a side of the light-emitting units 3' facing a light-exiting direction of the display panel. The filter structure 4' is only located in a light-exiting region, but not in a part of the optical component-arranging region 2' where no light-emitting unit 3' is provided. The inventor's research found that, when the external ambient light is incident on the part of the optical component-arranging region 2' where no light-emitting unit 3' is provided, the external ambient light will directly enter the interior of this part of region and then will be reflected to the human eyes by a film layer with reflective properties in this part of region, such as a cathode of the light-emitting unit 3', resulting in a relatively high reflectivity of the optical component-arranging region 2' and the problem that metals are visible, which affects user experience.

Figure 2:
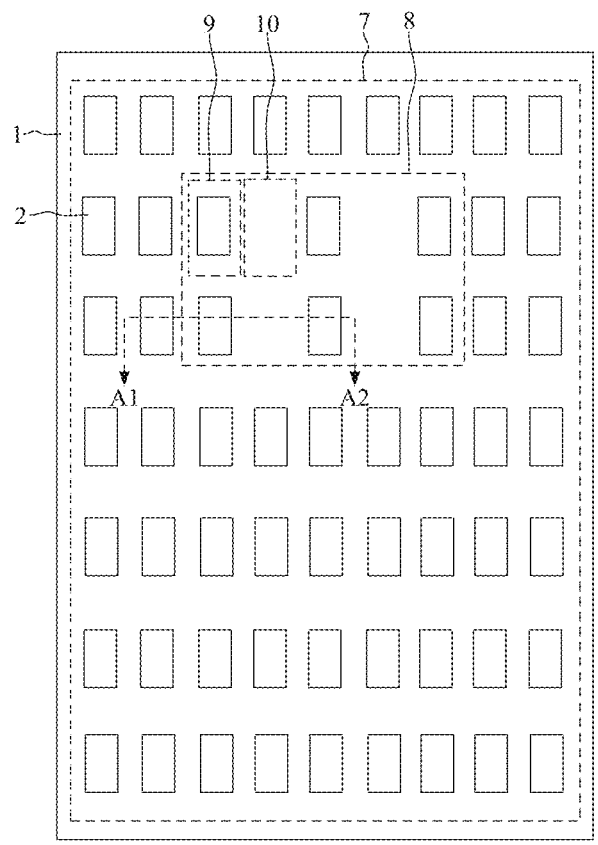
FIG. 2 is a schematic structural diagram of a display panel provided by an embodiment of the present disclosure.
Figure 3:
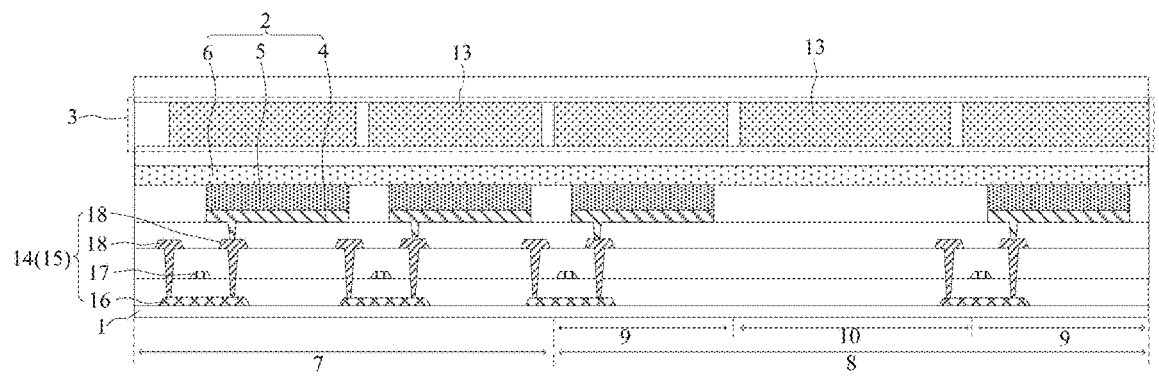
FIG. 3 is a cross-sectional view taken along an A1-A2 direction in FIG. 2.

In view of the above, an embodiment of the present disclosure provides a display panel, as shown in FIG. 2 and FIG. 3. FIG. 2 is a schematic structural diagram of the display panel provided by the embodiment of the present disclosure, and FIG. 3 is a cross-sectional view along an A1-A2 direction in FIG. 2. The display panel includes a substrate 1, a plurality of light-emitting units 2 and a filter layer 3 that are sequentially arranged along a light-exiting direction of the display panel. Each light-emitting unit 2 includes an anode 4, a light-emitting layer 5 and a cathode 6 that are stacked along the light-exiting direction of the display panel. In addition, the display panel further includes a main display region 7 and an optical component-arranging region 8. The main display region 7 is a region where images are displayed, and the optical component-arranging region 8 is a region where optical components such as cameras are arranged, so as to realize a camera function. In order to ensure a higher light transmittance of the optical component-arranging region 8, a density of the light-emitting units 2 located in the optical component-arranging region 8 is smaller than a density of the light-emitting units 2 located in the main display region 7.

The optical component-arranging region 8 includes a plurality of light-emitting regions 9 and a plurality of light-transmitting regions 10. The light-emitting units 2 provided in the optical component-arranging region 8 are located in the light-emitting regions 9. The filter layer 3 includes a plurality of color resistors 13. In a direction perpendicular to a plane of the substrate 1, some color resistors of the plurality of color resistors 13 overlap the plurality of light-transmitting regions 10.

In the embodiment of the present disclosure, the filter layer 3 is arranged in such a manner that some color resistors 13 in the filter layer 3 overlap the light-transmitting regions 10. In this way, when the ambient light is transmitted towards the light-transmitting regions 10 and enters these color resistors 13, each of these color resistors 13 can filter light rays having different colors from itself. Thus, amount of light rays entering the light-transmitting regions 10 can be reduced, and amount of light rays reflected to human eyes by a film layer having reflective properties, for example, a cathode 6 of the light-emitting unit 2, in the light-transmitting region 10 can be reduced.

Tests show that when the light-transmitting region 10 was provided with no color resistor 13, a reflectivity of the light-transmitting region 10 was up to 34.3%, while the reflectivity of the light-transmitting region 10 was reduced to 20% or less when the light-transmitting region 10 is provided with the color resistor 13. In this regard, the display panel provided by the embodiments of the present disclosure can effectively reduce the reflectivity of the light-transmitting region 10 of the optical component-arranging region 8, and can improve anti-reflection performance of the light-transmitting region 10, effectively avoiding the phenomenon that metals in the optical component-arranging region 8 are visible.

In addition, it should also be noted that in the conventional display panel, a polarizer assembly is usually used to provide the anti-reflection function. For example, the polarizer assembly may include a linear polarizer and a quarter-wave plate. In the presence of the polarizer assembly, circularly polarized light of the ambient light is converted into linearly polarized light after passing through the linear polarizer, and then enters the interior of the display panel through the quarter-wave plate. The light entering the interior of the display panel is reflected by a film layer in the display panel, and then, the reflected light passes through the quarter wave-plate again. A phase angle of the converted linearly polarized light differs from a phase angle of the linear polarizer by 90°, and as a result, the reflected light cannot exit through the linear polarizer. In the embodiments of the present disclosure, instead of using the polarizer assembly, the color resistors 13 are configured to provide the anti-reflection function. On the one hand, the color resistors 13 in the region where the light-emitting units 2 are located can realize their anti-reflection function while filtering a spectrum of the light rays emitted by the light-emitting units 2, to narrow the spectrum, thereby improving the color purity of the emitted light and optimizing the display effect. On the other hand, since the color resistor 13 has a higher light transmittance than the polarizer, the color resistors 13 located in the light-transmitting region 10 can reduce the reflectivity of the light-transmitting region 10 while ensuring the relative high light transmittance of the light-transmitting region 10. In this way, the light-transmitting region has both low reflectivity and high light transmittance, which ensures high imaging quality.

In addition, it should also be noted that, further with reference to FIG. 3, in order to drive the light-emitting units 2 to emit light normally, the display panel further includes pixel circuits 14, each electrically connected to one of the light-emitting units 2. Each of the pixel circuits 14 includes a plurality of thin film transistors 15, each including an active layer 16, a gate electrode 17 and a source-drain electrode layer 18 that are sequentially arranged along the light-exiting direction of the display panel. The pixel circuit 14 corresponding to the light-emitting unit 2 in the main display region 7 can be arranged in a conventional manner and is located between the light-emitting unit 2 and the substrate 1. The location of the pixel circuit 14 corresponding to the light-emitting unit 2 in the optical component-arranging region 8 can be adjusted according to actual needs. For example, further referring to FIG. 3, the pixel circuit 14 corresponding to each light-emitting unit 2 in the optical component-arranging region 8 is also located between the light-emitting unit 2 and the substrate 1. In other embodiments of the present disclosure, in order to further increase the light transmittance of the light-transmitting region 10, a transitional region may be additionally provided between the optical component-arranging region 8 and the main display region 7, the pixel circuit 14 corresponding to each light-emitting unit 2 in the optical component-arranging region 8 is transferred into the transitional region, and a connecting lead is connected between the light-emitting unit 2 and the pixel circuit 14.

Figure 4:
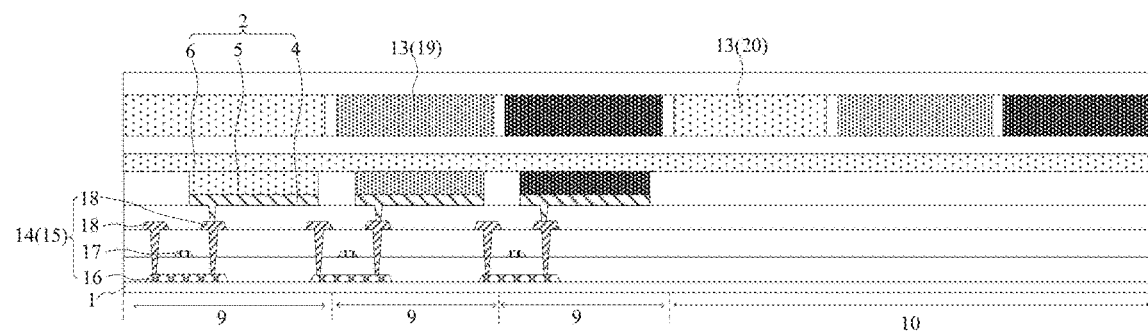
FIG. 4 is a schematic structural diagram of a filter layer provided by an embodiment of the present disclosure.

FIG. 4 is a schematic structural diagram of the filter layer provided by an embodiment of the present disclosure. As shown in FIG. 4, the color resistors 13 include first color resistors 19 and second color resistors 20. Each first color resistor 19 is located in one light-emitting region 9 and has the same color as a color of light that is emitted from the light-emitting region 9 where the first color resistor 19 is located. Each second color resistor 20 is located in one light-transmitting region 10 and the second color resistors 20 have at least two different colors.

Regarding the first color resistors 19, since the color of each first color resistor 19 has the same color as a color of light emitted from the light-emitting region 9 where the first color resistor 19 is located, the first color resistor 19 can filter a spectrum of the light emitted from the light-emitting unit 2 in the light-emitting region 9, to narrow the spectrum and improve the color purity of the emitted light, thereby optimizing the display effect of the light-emitting region 9.

Regarding the second color resistors 20, when the optical components in the optical component-arranging region 8 capture images, the ambient light enters the optical components through the light-transmitting regions 10, and if the second color resistors 20 in the light-transmitting regions 10 have only one color, the second color resistors 20 will completely filter out all light rays of the ambient light that have different colors from the second color resistors 20 when the ambient light is transmitted thereto, resulting that light of a single color can be incident to the light-transmitting regions 10 after the filtering. In this way, on one hand, the light reflected by the film layer in the light-transmitting regions 10 to the human eyes also has a single color, which results in the phenomenon that the metals are more visible, and on the other hand, the imaging effect will be also affected when light having a single color enters the optical components. In contrast, by arranging that the second color resistors 20 located in the light-transmitting regions 10 have at least two different colors, for example, the second color resistors 20 including a red color resistor, a green color resistor and a blue color resistor, red light in the ambient light can enter the light-transmitting regions 10 through the red color resistor to be reflected, green light in the ambient light can enter the light-transmitting regions 10 through the green color resistor to be reflected, and blue light in the ambient light can enter the light-transmitting regions 10 through the blue color resistor to be reflected, which not only weakens visibility of metals, but ensures that light of various colors can enter the optical components through the second color resistors 20 of corresponding colors, thereby guaranteeing normal imaging.

Figure 5:
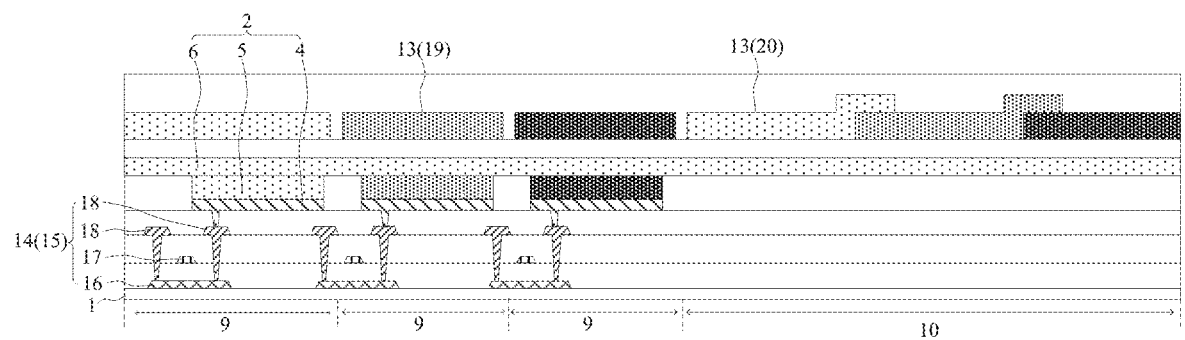
FIG. 5 is another schematic structural diagram of a filter layer provided by an embodiment of the present disclosure.

FIG. 5 is another schematic structural diagram of the filter layer provided by an embodiment of the present disclosure. In the embodiment illustrated in FIG. 5, in the direction perpendicular to the plane of the substrate 1, the second color resistors 20 cover the light-transmitting regions 10. In this case, the second color resistors 20 can filter a part of the ambient light incident on each of the light-transmitting regions 10, improving uniformity of reflectivity of the optical component-arranging region 8. In this way, the phenomenon that metals in the optical component-arranging region 8 are visible can be effectively weakened.

In the case where the second color resistors 20 cover the light-transmitting regions 10, these second color resistors 20 may be spliced to each other, i.e., adjacent second color resistors 20 are in contact with each other without overlapping. However, with such an arrangement, a position or a size of the second color resistor 20 may have a certain deviation due to process errors during a manufacturing process of the second color resistor 20, resulting in a failure of ideal splicing between the actually formed second color resistors 20. Accordingly, a gap may be present between the second color resistors 20, and thus the second color resistors 20 cannot completely cover the light-transmitting region 10.

Further referring to FIG. 5, in this embodiment of the present disclosure, in the case where the second color resistors 20 cover the light-transmitting regions 10, at least one second color resistor 20 can overlap another second color resistor 20 adjacent thereto. The overlapping region reserves a floating space for process errors. In this way, even if the position or size of the second color resistor 20 deviates from a design value thereof due to the process errors, it can still be guaranteed that no gap is present between adjacent second color resistors 20, so as to realize better coverage of the light-transmitting region 10 by the second color resistors 20.

Figure 6:
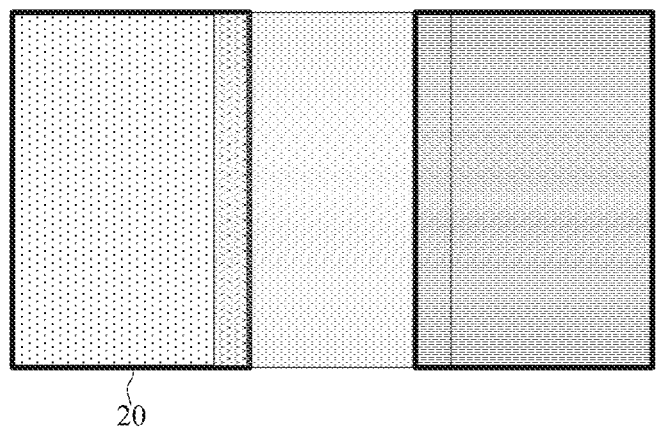
FIG. 6 is a schematic diagram of the overlapping second color resistors having a rectangular shape according to an embodiment of the present disclosure.
Figure 7:
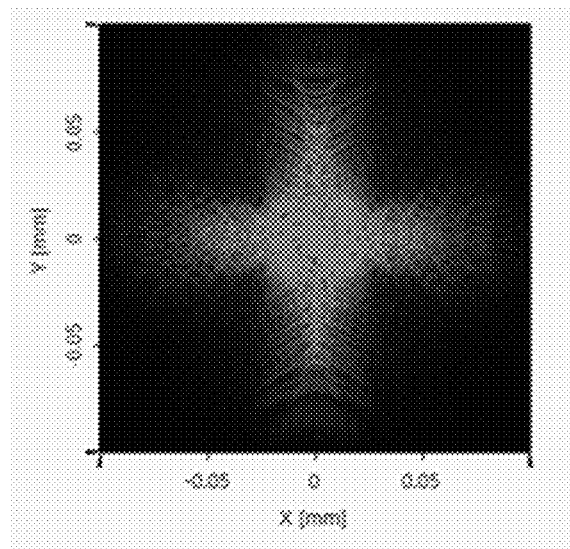
FIG. 7 is a schematic diagram of light diffraction at a boundary of an overlapping region extending in a straight line according to an embodiment of the present disclosure.

FIG. 6 is a schematic diagram of overlapped second color resistors each having a rectangular shape according to an embodiment of the present disclosure. When the second color resistor 20 overlaps an adjacent second color resistor 20 and the second color resistors each have a regular rectangular shape, as shown in FIG. 6, a boundary of the overlapping region of the two second color resistors 20 also extends in a straight line. FIG. 7 is a schematic diagram of light diffraction at the boundary of the overlapping region extending in a straight line according to an embodiment of the present disclosure. FIG. 7 shows that serious diffraction phenomena occur in the overlapping region, which may negatively affect the imaging quality.

Figure 8:
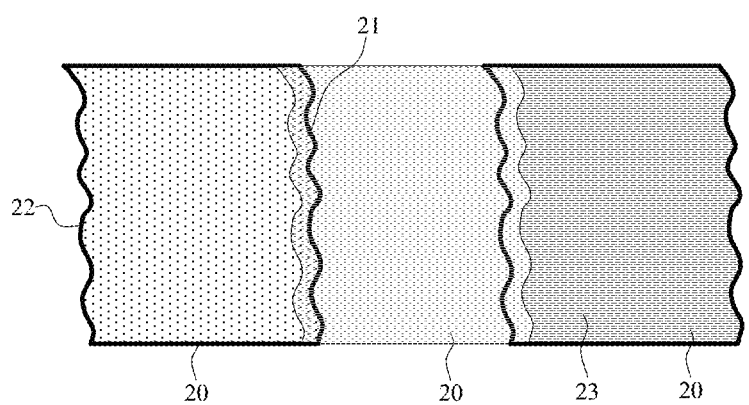
FIG. 8 is a top view of second color resistors in a light-transmitting region shown in FIG. 5.
Figure 9:
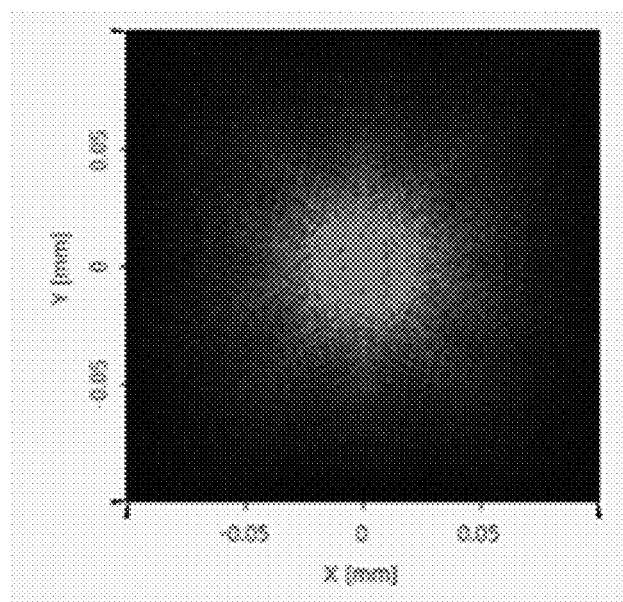
FIG. 9 is a schematic diagram of light diffraction at a boundary of an overlapping region extending in a wavy line according to an embodiment of the present disclosure.

FIG. 8 is a top view of second color resistors in a light-transmitting region shown in FIG. 5. In the embodiment illustrated in FIG. 8, each second color resistor 20 includes a first edge 21. In the direction perpendicular to the plane of the substrate 1, an orthographic projection of the first edge 21 of one second color resistor 20 is located within an orthographic projection of another second color resistor 20 adjacent thereto, and the first edge 21 has a non-linear shape. In other words, the edge of the second color resistor 20 that overlaps another second color resistor 20 is a non-linear edge. Such an arrangement allows the boundary of the overlapping region to be non-linear. FIG. 9 is a schematic diagram of light diffraction at a boundary of an overlapping region extending in a wavy shape according to an embodiment of the present disclosure. With reference to FIG. 9, it is shown that, compared with the outcome shown in FIG. 7, a degree of light diffraction at the overlapping region is significantly weakened when the boundary of the overlapping region is non-linear, effectively reducing the effect of diffraction on the imaging quality.

Further, the aforementioned non-linear shape may be an arc or a wavy shape. In this case, the boundary of the overlapping region between two adjacent second color resistors 20 is more irregular, weakening the degree of light diffraction to a greater extent.

Further referring to FIG. 8, the second color resistor 20 also includes a second edge 22 opposite from the first edge 21. In order to reduce the diffraction phenomenon at the second edge 22, the second edge 22 can have the same shape as the first edge 21. That is, the second edge 22 may also have a non-linear shape, for example, an arc shape or a wavy shape.

Figure 10:
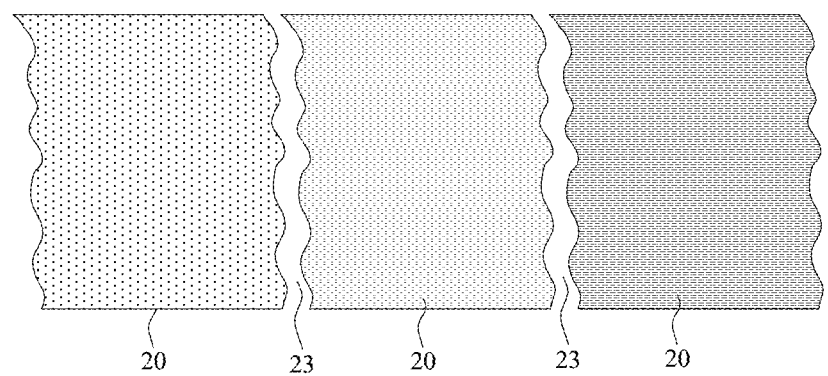
FIG. 10 is a top view of second color resistors of a light-transmitting region shown in FIG. 4.

FIG. 10 is a top view of second color resistors of a light-transmitting region shown in FIG. 4. With reference to FIG. 4 and FIG. 10, a gap 23 is present between two adjacent second color resistors 20. In this case, no overlapping region exists between the second color resistors 20, and an overall film thickness occupied by the second color resistors 20 is equal to a thickness of the second color resistor 20, which is more conducive to a design of thin and light display panel. In addition, the gap 23 can extend non-linearly, in order to weaken the light diffraction phenomenon in the gap and optimize the imaging quality. In this case, the edge of the second color resistor 20 at the gap is a non-linear edge. Further, the edge of the second color resistor 20 at the gap can be an arc or a wavy edge.

Figure 11:
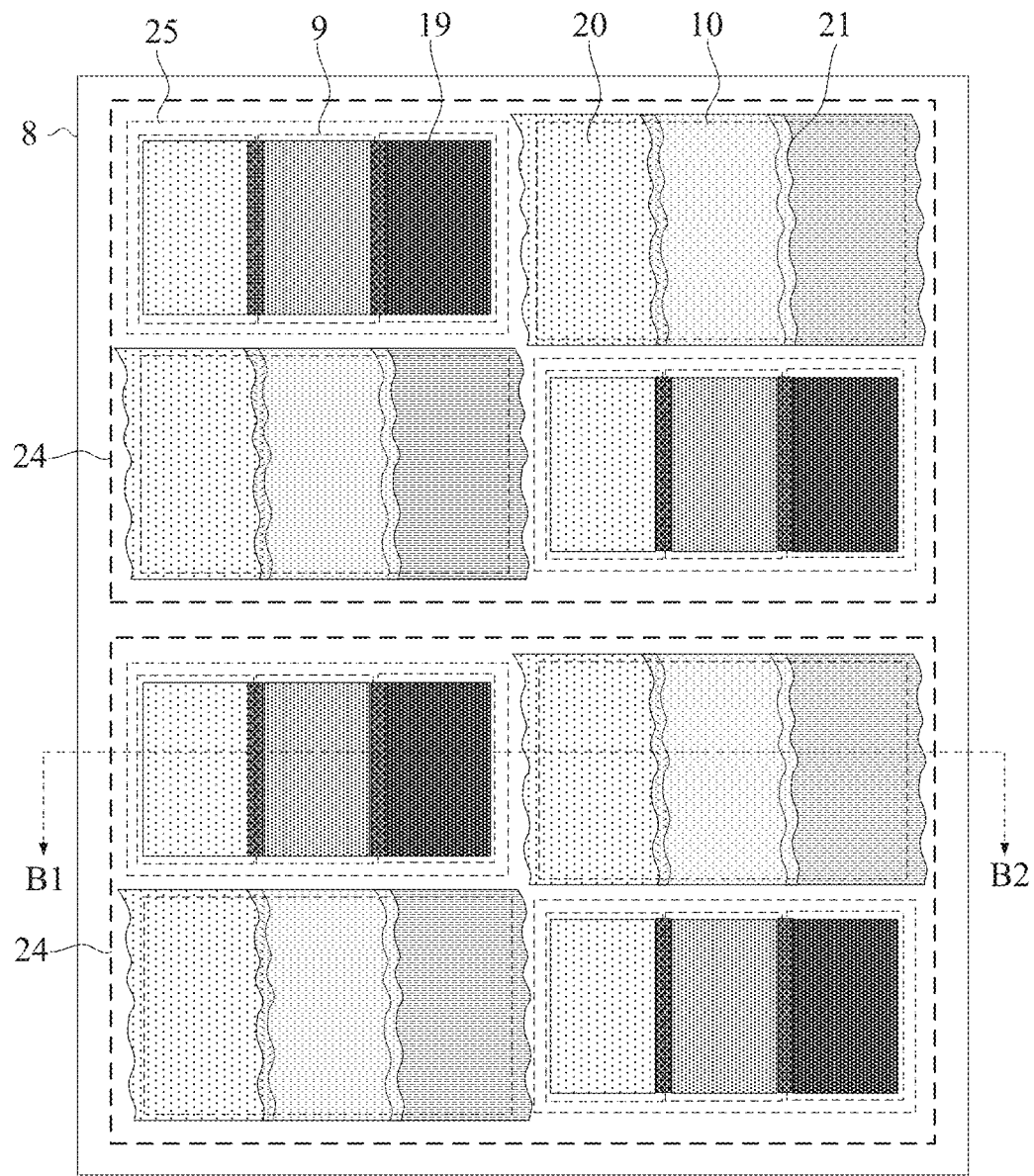
FIG. 11 is a schematic diagram of an arrangement of light-emitting regions and light-transmitting regions in an optical component-arranging region according to an embodiment of the present disclosure.
Figure 12:
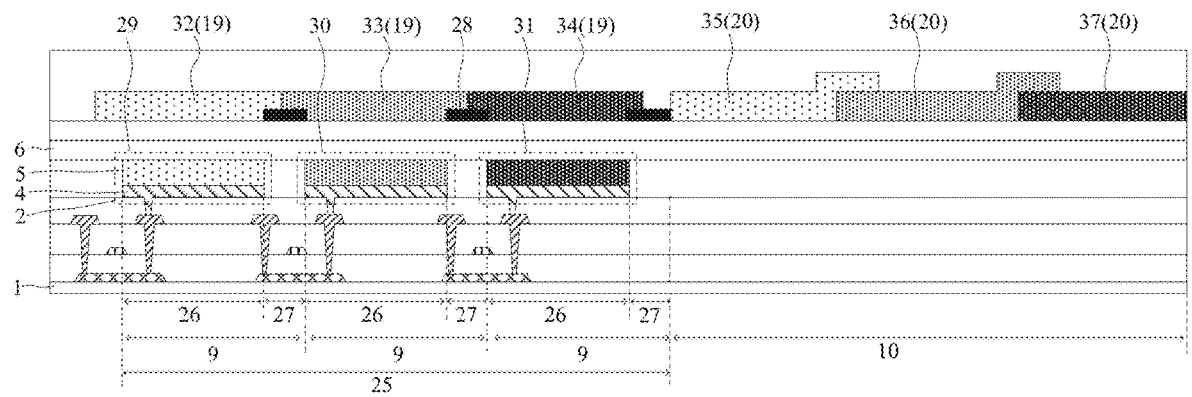
FIG. 12 is a cross-sectional view taken along a direction of B1-B2 in FIG. 11.

FIG. 11 is a schematic diagram of an arrangement of light-emitting regions and light-transmitting regions in the optical component-arranging region 8 according to an embodiment of the present disclosure, and FIG. 12 is a cross-sectional view along a direction of B1-B2 in FIG. 11. As shown in FIG. 11 and FIG. 12, the optical component-arranging region 8 include a plurality of first regions 24, each first region 24 includes at least one pixel region 25 and at least one light-transmitting region 10, and each pixel region 25 includes at least two light-emitting regions 9 of different colors. In such an arrangement, the light-emitting regions 9 in the same pixel region 25 are closely arranged, and the light-transmitting regions 10 are scattered and independently arranged around the pixel region 25. In this case, a single light-transmitting region 10 has a larger light-transmitting area, which allows the external ambient light to be concentrated and transmitted into the optical components in the light-transmitting region 10, thereby optimizing the imaging quality.

Further referring to FIG. 12, each light-emitting region 9 includes an opening region 26 and a non-opening region 27. The opening region 26 positionally corresponds to the light-emitting layer 5 in the light-emitting unit 2, and the opening region 26 is a light-exiting region in the light-emitting region 9. The non-opening region 27 is a non-light-exiting region in the light-emitting region 9. The first color resistor 19 is located in the opening region 26 for filtering the spectrum of the light emitted from the light-emitting region 9, to narrow the spectrum and improve the color purity of the emitted light, thereby optimizing the display effect of the light-emitting region 9. In addition, the filter layer 3 further includes black matrices 28 each located in the non-opening region 27 and configured to block light emitted obliquely and having other colors, so as to avoid color mixing. Moreover, the black matrix 28 and the first color resistor 19 cooperatively play an anti-reflection function, reducing the reflectivity of the optical component-arranging region 8 to a greater extent.

Further referring to FIG. 12, the pixel region 25 is composed of a red light-emitting region 29, a green light-emitting region 30 and a blue light-emitting region 31; the first color resistors 19 include a red first color resistor 32 located in the red light-emitting region 29, a green first color resistor 33 located in the green light-emitting region 30, and a blue first color resistor 34 located in the blue light-emitting region 31. The second color resistors 20 include a red second color resistor 35, a green second color resistor 36, and a blue second color resistor 37, and each light-transmitting region 10 includes at least one red second color resistor 35, at least one green second color resistor 36 and at least one blue second color resistor 37.

With the aforementioned arrangement manner, each light-transmitting region 10 is provided with the second color resistors 20 of different colors, such that the red light in the external ambient light can be transmitted via the red second color resistor, the green light in the external ambient light can be transmitted via the green second color resistor, and the blue light in the external ambient light can be transmitted via the blue second color resistor. In this way, all the red, green, and blue light can enter the optical components respectively via the second color resistors 20 of the corresponding colors, thereby ensuring normal imaging of the optical components.

In addition, by setting the second color resistors 20 to be the red second color resistor 35, the green second color resistor 36 and the blue second color resistor 37, the red second color resistor 35 and the red first color resistor 32 can be formed in the same patterning process; the green second color resistor 36 and the green first color resistor 33 can be formed in the same patterning process; and the blue second color resistor 37 and the blue first color resistor 34 can be formed in the same patterning process. Thus, no additional process steps are required for forming the second color resistors 20, simplifying the process flow and reducing the process cost.

Further referring to FIG. 11 and FIG. 12, in each light-transmitting region 10, at least one second color resistor 20 overlaps another second color resistor 20 adjacent thereto. With such an arrangement, the overlapping region reserves a floating space for process errors. In this way, even if the position or size of the second color resistor 20 deviates from a standard value thereof due to the process errors, it can still be guaranteed that no gap is present between adjacent second color resistors 20, so as to realize a better coverage to the light-transmitting region 10 by the second color resistors 20 and to improve uniformity of the reflectivity in different parts of the optical component-arranging region 8. In addition, in combination with FIG. 8, the second color resistor 20 includes the first edge 21. In the direction perpendicular to the plane of the substrate 1, an orthographic projection of the first edge 21 is located within an orthographic projection of an adjacent second color resistor 20, and the first edge 21 has a non-linear shape. As the edge of the second color resistor 20 that overlaps another second color resistor 20 is a non-straight edge, the boundary of the overlapping region between two adjacent second color resistors 20 can have an irregular shape, which effectively weakens the degree of light diffraction and reduces the influence of the light diffraction on the image quality.

Further, the aforementioned non-linear shape may be an arc or wavy shape. In this case, the boundary of the overlapping region between two adjacent second color resistors 20 is more irregular, thereby weakening the degree of light diffraction to a greater extent.

Figure 13:
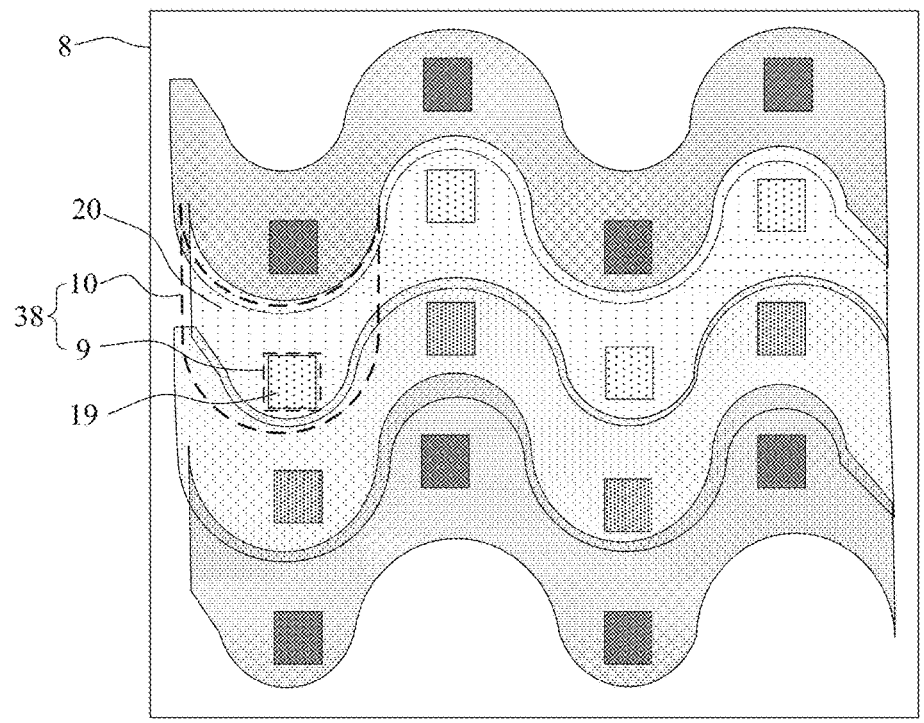
FIG. 13 is a schematic diagram of another arrangement of light-emitting regions and light-transmitting regions in an optical component-arranging region according to an embodiment of the present disclosure.
Figure 14:
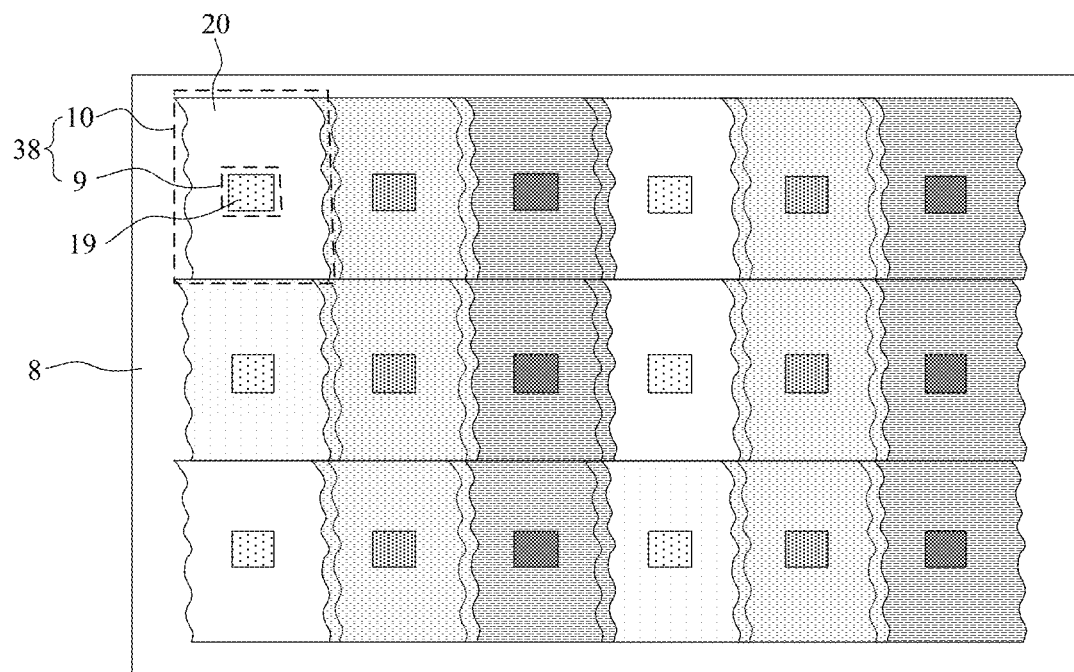
FIG. 14 is a schematic diagram of yet another arrangement of light-emitting regions and light-transmitting regions in an optical component-arranging region according to an embodiment of the present disclosure.

FIG. 13 is a schematic diagram of another arrangement of the light-emitting regions and the light-transmitting regions in the optical component-arranging region 8 according to an embodiment of the present disclosure, and FIG. 14 is a schematic diagram of yet another arrangement of the light-emitting regions and the light-transmitting regions in the optical component-arranging region 8 according to an embodiment of the present disclosure. As shown in FIG. 13 and FIG. 14, the optical component-arranging region 8 includes a plurality of second regions 38, each second region 38 includes one light-emitting region 9 and one light-transmitting region 10 surrounding the light-emitting region 9.

With such an arrangement, the light-emitting regions 9 are uniformly dispersed in the optical component-arranging region 8, such that the light emitted from the optical component-arranging region 8 is more uniform, thereby optimizing the display effect of the optical component-arranging region 8. In addition, the light-transmitting regions 10 are also uniformly dispersed in the optical component-arranging region 8, which improves the uniformity of the light transmittance of different parts of the optical component-arranging region 8 and optimizes the imaging quality in the meantime.

Further, it should be noted that, referring to FIG. 13 and FIG. 14, the arrangement of the light-transmitting regions 10 may change in accordance with the change of arrangement of the light-emitting region 9 in the optical component-arranging region 8.

Further referring to FIG. 13 and FIG. 14, in the same second region 38, the first color resistor 19 and the second color resistor 20 have the same color and are connected to each other in such manner that no gap is formed between the first color resistor 19 and the second color resistor 20, and the first color resistor 19 and the second color resistor 20 do not overlap each other either.

Since the light emitted from the light-emitting region 9 is relatively divergent, when the first color resistor 19 and the second color resistor 20 of the same color are arranged in the same second region 38 and have the same color as the light emitted from the light-emitting region 9, the light that is emitted from the light-emitting region 9 obliquely towards the region where the second color resistor 20 is located can still be filtered by the second color resistor 20, so that a spectrum thereof is narrowed and the color purity thereof is improved. When the first color resistor 19 and the second color resistor 20 arranged in the same second region 38 have different colors, the light emitted from the light-emitting region 9 obliquely will be filtered by the peripheral second color resistor 20 and thus cannot exit through the second color resistor 20, which reduces a light-exiting range.

In an embodiment, at least one second color resistor 20 each is connected to another second color resistor 20 adjacent thereto. It should be understood that the connection between two adjacent second color resistors 20 indicates that the two adjacent second color resistors 20 are in contact with each other. In this case, the second color resistors 20 cover the light-transmitting region 10, the second color resistors 20 can filter a part of the ambient light incident on each part of the light-transmitting region 10, thereby improving the uniformity of reflectivity of different parts of the optical component-arranging region 8. In this way, the phenomenon that metals are visible in each part of the optical component-arranging region 8 can be effectively weakened.

Further referring to FIG. 13 and FIG. 14, in the case where the second color resistors 20 cover the light-transmitting region 10, at least one second color resistor 20 each overlaps another second color resistor 20 adjacent thereto. With such an arrangement, the overlapping region reserves a floating space for process errors. In this way, even if the position or size of the second color resistor 20 deviates from a standard value thereof due to the process errors, it can still be guaranteed that no gap is present between adjacent second color resistors 20, so as to realize better coverage to the light-transmitting region 10 by the second color resistors 20 and improve the uniformity of the reflectivity in each part of the light-transmitting region 10. In addition, in combination with FIG. 8, the second color resistor 20 includes the first edge 21. In the direction perpendicular to the plane of the substrate 1, the orthographic projection of the first edge 21 is located within the orthographic projection of an adjacent second color resistor 20, and the first edge 21 has a non-linear shape. As the edge of one second color resistor 20 that overlaps another second color resistor 20 is a non-linear edge, the boundary of the overlapping region between the two adjacent second color resistors 20 can have an irregular shape, which effectively weakens the degree of light diffraction and reduces the influence of the light diffraction on the image quality.

Further, it should be noted that the overlapping region between two adjacent second color resistors 20 can be reused as a black matrix. In an example, in which a red light-emitting region is adjacent to a green light-emitting region, in the second region 38 where the red light-emitting region is located, the first color resistor 19 and the second color resistor 20 are both red color resistors; in the second region 38 where the green light-emitting region is located, the first color resistor 19 and the second color resistor 20 are both green color resistors; and the red second color resistor 20 overlaps the green second color resistor 20. In this case, when light emitted obliquely from the red light-emitting region is transmitted towards the second region 38 where the green light-emitting region is located, in the overlapping region of the second color resistors 20, the light can exit only through the red second color resistor 20 in the overlapping region and cannot exit through the green second color resistor 20, such that the light is prevented from exiting obliquely through the display panel, thereby avoiding color mixing at the green light-emitting region. Similarly, when light emitted obliquely from the green light-emitting region is transmitted towards the second region 38 where the red light-emitting region is located, in the overlapping region of the second color resistors 20, the light can exit only through the green second color resistor 20 in the overlapping region and cannot exit through the red second color resistor 20, such that the light is prevented from exiting obliquely through the display panel, thereby avoiding color mixing at the red light-emitting region. Moreover, when the overlapping region of the adjacent second color resistors 20 is reused as a black matrix, it is unnecessary to provide an additional black matrix in the optical component-arranging region 8 to avoid color mixing, which prevents such a black matrix from shielding the optical component-arranging region 8, also simplifies the process flow and reduces the process cost.

Further, the aforementioned non-linear shape may be an arc or a wavy shape. In this case, the boundary of the overlapping region between two adjacent second color resistors 20 is more irregular, thereby weakening the degree of light diffraction to a greater extent.

Further, two adjacent second color resistors 20 of the same color are connected to each other in such a manner that no gap is formed between the two adjacent second color resistors 20 and the two adjacent second color resistors 20 do not overlap each other either. In this case, the two adjacent second color resistors 20 of the same color are formed into one piece, instead of being formed as independent color resistors. In this way, it is ensured that no gap is present between these color resistors, which prevents the ambient light from entering through the gap, thereby improving an anti-reflection performance of the light-transmitting region 10.

Figure 15:
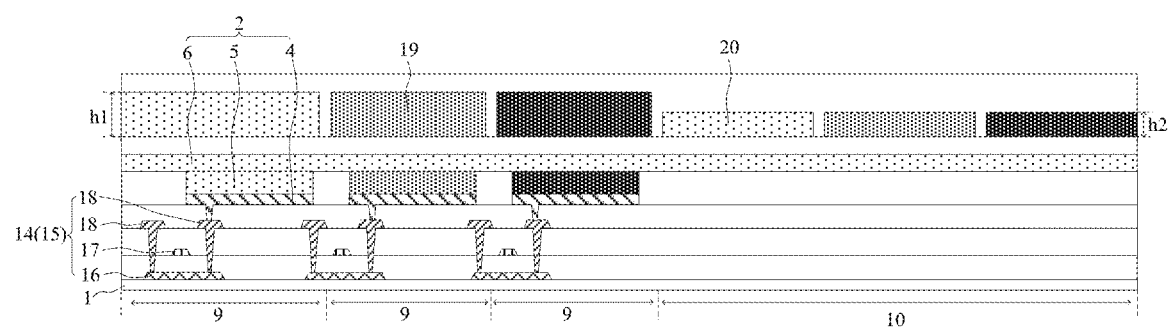
FIG. 15 is a schematic diagram illustrating thicknesses of first color resistors and second color resistors according to an embodiment of the present disclosure.

FIG. 15 is a schematic diagram illustrating thicknesses of first color resistors and second color resistors according to an embodiment of the present disclosure. As shown in FIG. 15, in the direction perpendicular to the plane of the substrate 1, a thickness of the first color resistor 19 is h1, a thickness of the second color resistor 20 is h2, where h2 is smaller than h1.

The light transmittance of the color resistor decreases with an increase in the thickness of the color resistor. By setting that the second color resistors 20 have smaller thickness, the anti-reflection performance of the light-transmitting region 10 is optimized by the second color resistors 20, and it is also avoided that the second color resistors 20 filter too much ambient light incident on the light-transmitting region 10. In this way, it is ensured that sufficient amount of light can be transmitted into the optical components through the light-transmitting region 10, such that the light-transmitting region 10 has both low reflectivity and high light transmittance, simultaneously weakening the phenomenon that metals are visible and improving the imaging quality.

In order to further allow sufficient amount of ambient light to be transmitted into the optical components through the light-transmitting region 10, in the direction perpendicular to the plane of the substrate 1, the second color resistor 20 has a thickness smaller than 5 μm.

Figure 16:
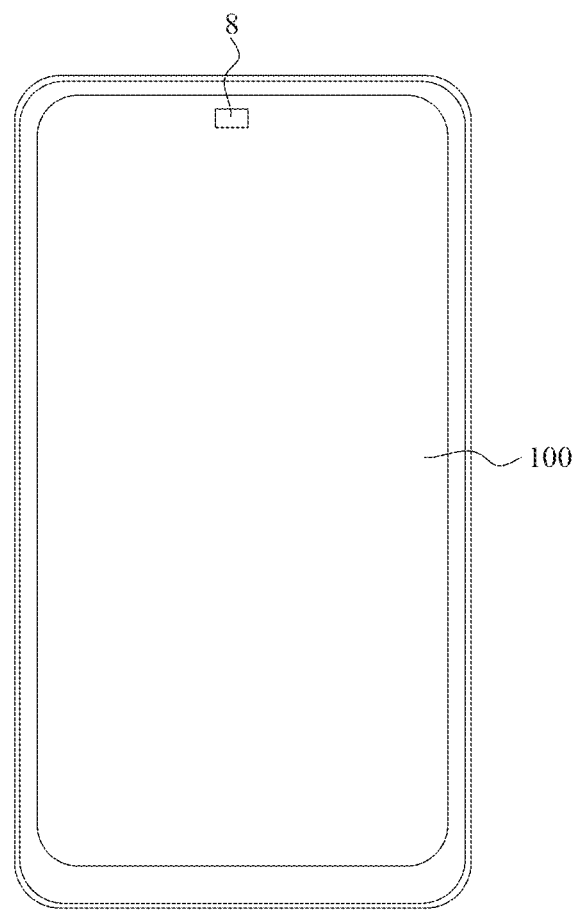
FIG. 16 is a structural schematic diagram of a display apparatus according to an embodiment of the present disclosure.

An embodiment of the present disclosure further provides a display apparatus. FIG. 16 is a structural schematic diagram of a display apparatus according to an embodiment of the present disclosure. As shown in FIG. 16, the display apparatus includes the display panel 100 described above. The specific structure of the display panel 100 has been described in detail in the above embodiments, which will not be repeated herein. The display apparatus shown in FIG. 16 is merely illustrative, and the display apparatus may be any electronic apparatus with a display function, such as a mobile phone, a tablet computer, a notebook computer, an electronic paper book, or a television.

The display apparatus provided by the embodiment of the present disclosure includes the above display panel 100. Thus, when using this display apparatus, by overlapping some color resistors 13 in the filter layer 3 with the light-transmitting regions 10 in the optical component-arranging region 8, when the ambient light is transmitted towards the light-transmitting regions 10, each of these color resistors 13 can filter a part of the ambient light having colors different from itself. Thus, amount of light rays entering the light-transmitting region 10 can be reduced, and amount of light rays reflected by the cathode 6 or other film layers in the light-transmitting region 10 to human eyes can be reduced. In this way, the reflectivity of the light-transmitting regions 10 in the optical component-arranging region 8 can be effectively reduced, and thus the phenomenon that metals in the optical component-arranging region 8 are visible can be effectively weakened.

The above are merely some embodiments of the present disclosure, and are not intended to limit the present disclosure. Any modifications, equivalent substitutions or improvements made within the principles of the present disclosure shall be included in the protection scope of the present disclosure.

It should be noted that the above embodiments are only used to illustrate, but not to limit the technical solutions of the present disclosure. Although the present application is described in detail with reference to the foregoing embodiments, those skilled in the art shall understand that they can modify the technical solutions described in the foregoing embodiments, or equivalently replace some or all of the technical features. The modifications or replacements shall not direct the essence of the corresponding technical solutions away from the scope of the technical solutions of the embodiments of the present disclosure.

What is claimed is:

1. A display panel, the display panel having a main display region and an optical component-arranging region,
   wherein the display panel comprises:
   a substrate;
   a plurality of light-emitting units located in the main display region and the optical component-arranging region, wherein each light-emitting unit comprises a light-emitting layer; and
   a filter layer comprising a plurality of color resistors,
   wherein the substrate, the plurality of light-emitting units and the filter layer are sequentially arranged along a light-exiting direction of the display panel,
   wherein a density of light-emitting units of the plurality of light-emitting units located in the optical component-arranging region is smaller than a density of light-emitting units of the plurality of light-emitting units located in the main display region,
   wherein the optical component-arranging region comprises a plurality of light-emitting regions and a plurality of light-transmitting regions, and the light-emitting units of the plurality of light-emitting units located in the optical component-arranging region are arranged in the plurality of light-emitting regions,
   wherein, in a direction perpendicular to a plane of the substrate, some color resistors of the plurality of color resistors overlap the plurality of light-transmitting regions,
   wherein the plurality of color resistors comprises first color resistors and second color resistors, wherein each of the first color resistors is located in one of the plurality of light-emitting regions and has a same color as a color of light emitted from the one of the plurality of light-emitting regions where the first color resistor is located, wherein each of the second color resistors is located in one of the plurality of light-transmitting regions, and wherein the second color resistors have at least two different colors, and wherein in the direction perpendicular to the plane of the substrate, orthographic projections of the second color resistors cover the plurality of light-transmitting regions; or wherein the optical component-arranging region comprises a plurality of first regions, wherein each of the plurality of first regions comprises at least one pixel region and at least one light-transmitting region of the plurality of light-transmitting regions, and each of the at least one pixel region comprises at least two light-emitting regions of the plurality of light-emitting regions that have different colors; or wherein the optical component-arranging region comprises a plurality of second regions, and each of the plurality of second regions comprises one light-emitting region of the plurality of light-emitting regions and one light-transmitting region of the plurality of light-transmitting regions, the one light-transmitting region surrounding the one light-emitting region.

2. The display panel according to claim 1, wherein at least a portion of each of the second color resistors overlaps a second color resistor of the second color resistors adjacent thereto.

3. The display panel according to claim 2, wherein each of the second color resistors comprises a first edge, wherein in the direction perpendicular to the plane of the substrate, an orthographic projection of the first edge is located within an orthographic projection of the second color resistor adjacent thereto, and wherein the first edge has a non-linear shape.

4. The display panel according to claim 3, wherein the non-linear shape is an arc shape.

5. The display panel according to claim 3, wherein the non-linear shape is a wavy shape.

6. The display panel according to claim 5, wherein each of the second color resistors further comprises a second edge opposite to the first edge, and wherein the second edge has a same shape as the first edge.

7. The display panel according to claim 1, wherein a gap is formed between two adjacent second color resistors of the second color resistors, and wherein the gap extends non-linearly.

8. The display panel according to claim 1, wherein each of the plurality of light-emitting regions comprises an opening region and a non-opening region, and wherein each of the first color resistors is located in the opening region of the light-emitting region where the first color resistor is located; and wherein the filter layer further comprises black matrixes, and each of the black matrixes is located in the non-opening region of one of the plurality of light-emitting regions.

9. The display panel according to claim 1, wherein each of the at least one pixel region comprises a red light-emitting region, a green light-emitting region and a blue light-emitting region;

wherein the first color resistors comprise a red first color resistor located in the red light-emitting region, a green first color resistor located in the green light-emitting region and a blue first color resistor located in the blue light-emitting region; and wherein the second color resistors comprise at least one red second color resistor, at least one green second color resistor and at least one blue second color resistor, and at least one of the at least one red second color resistor, at least one of the at least one green second color resistor and at least one of the at least one blue second color resistor are provided in each of the plurality of light-transmitting regions.

10. The display panel according to claim 9, wherein in each of the plurality of light-transmitting regions, at least one second color resistor of the second color resistors each overlaps one of the second color resistors that is adjacent to the at least one second color resistor, wherein each of the at least one second color resistor comprises a first edge, wherein in the direction perpendicular to the plane of the substrate, an orthographic projection of the first edge is located within an orthographic projection of the second color resistor adjacent thereto, and the first edge has a non-linear shape.

11. The display panel according to claim 10, wherein the non-linear shape is an arc shape or a wavy shape.

12. The display panel according to claim 1, wherein each first color resistor and each second color resistor in a same second region of the plurality of second regions have a same color and are connected to each other in such a manner that no gap is formed between the first color resistor and the second color resistor and the first color resistor and the second color resistor do not overlap with each other.

13. The display panel according to claim 12, wherein at least one of the second color resistors each is connected to a second color resistor of the second color resistors adjacent thereto.

14. The display panel according to claim 13, wherein at least one of the second color resistors each overlaps a second color resistor of the second color resistors adjacent thereto, wherein each of the at least one second color resistor comprises a first edge, wherein in the direction perpendicular to the plane of the substrate, an orthographic projection of the first edge is located within an orthographic projection of the second color resistor adjacent thereto, and wherein the first edge has a non-linear shape.

15. The display panel according to claim 14, wherein the non-linear shape is an arc shape or a wavy shape.

16. The display panel according to claim 12, wherein adjacent ones of the second color resistors that have a same color are in communication with each other.

17. The display panel according to claim 1, wherein in the direction perpendicular to the plane of the substrate, a thickness of each of the second color resistors is smaller than a thickness of each of the first color resistors.

18. The display panel according to claim 1, wherein in the direction perpendicular to the plane of the substrate, a thickness of each of the second color resistors is smaller than 5 μm.

19. A display apparatus, comprising a display panel having a main display region and an optical component-arranging region, wherein the display panel comprises:
a substrate;
a plurality of light-emitting units located in the main display region and the optical component-arranging region, wherein each light-emitting unit comprises a light-emitting layer; and a filter layer comprising a plurality of color resistors, wherein the substrate, the plurality of light-emitting units and the filter layer are sequentially arranged along a light-exiting direction of the display panel, wherein a density of light-emitting units of the plurality of light-emitting units located in the optical component-arranging region is smaller than a density of light-emitting units of the plurality of light-emitting units located in the main display region, wherein the optical component-arranging region comprises a plurality of light-emitting regions and a plurality of light-transmitting regions, and the light-emitting units of the plurality of light-emitting units located in the optical component-arranging region are arranged in the plurality of light-emitting regions, wherein in a direction perpendicular to a plane of the substrate, some color resistors of the plurality of color resistors overlap the plurality of light-transmitting regions, wherein the plurality of color resistors comprises first color resistors and second color resistors, wherein each of the first color resistors is located in one of the plurality of light-emitting regions and has a same color as a color of light emitted from the one of the plurality of light-emitting regions where the first color resistor is located, wherein each of the second color resistors is located in one of the plurality of light-transmitting regions, and wherein the second color resistors have at least two different colors, and wherein in the direction perpendicular to the plane of the substrate, orthographic projections of the second color resistors cover the plurality of light-transmitting regions; or wherein the optical component-arranging region comprises a plurality of first regions, wherein each of the plurality of first regions comprises at least one pixel region and at least one light-transmitting region of the plurality of light-transmitting regions, and each of the at least one pixel region comprises at least two light-emitting regions of the plurality of light-emitting regions that have different colors; or wherein the optical component-arranging region comprises a plurality of second regions, and each of the plurality of second regions comprises one light-emitting region of the plurality of light-emitting regions and one light-transmitting region of the plurality of light-transmitting regions, the one light-transmitting region surrounding the one light-emitting region.

* * * * *